(12) United States Patent
Calabró et al.

(10) Patent No.: US 10,680,648 B2
(45) Date of Patent: Jun. 9, 2020

(54) DECODING METHOD AND DECODING SYSTEM FOR A PARITY CHECK CODE

(71) Applicant: Xieon Networks S.a.r.l., Luxembourg (LU)

(72) Inventors: Stefano Calabró, Senningerberg (LU); Peter Kainzmaier, Senningerberg (LU); Heinrich Von Kirchbauer, Senningerberg (LU)

(73) Assignee: ZIEON NETWORKS S.a.r.l., Luxembourg (LU)

( * ) Notice: Subject to any disclaimer, the term of this patent is extended or adjusted under 35 U.S.C. 154(b) by 43 days.

(21) Appl. No.: 16/169,659

(22) Filed: Oct. 24, 2018

(65) Prior Publication Data

US 2019/0173493 A1     Jun. 6, 2019

(30) Foreign Application Priority Data

Dec. 6, 2017   (EP) .................................... 17205718

(51) Int. Cl.
   *H03M 13/11*   (2006.01)
   *H03M 13/00*   (2006.01)

(52) U.S. Cl.
   CPC ........ *H03M 13/112* (2013.01); *H03M 13/114* (2013.01); *H03M 13/116* (2013.01); *H03M 13/1114* (2013.01); *H03M 13/6502* (2013.01); *H03M 13/6566* (2013.01)

(58) Field of Classification Search
   CPC ............ H03M 13/112; H03M 13/1114; H03M 13/6566; H03M 13/114; H03M 13/116; H03M 13/6502
   See application file for complete search history.

(56) References Cited

U.S. PATENT DOCUMENTS

| 6,476,739 | B1 * | 11/2002 | Lui ................... H03M 13/4146 341/107 |
| 2005/0138519 | A1 | 6/2005 | Boutillon et al. | |
| 2005/0204272 | A1 * | 9/2005 | Yamagishi ......... H03M 13/1111 714/801 |

(Continued)

OTHER PUBLICATIONS

Bhatt, T. et al., "Pipelined Block-Serial Decoder Architecture for Structured LDPC Codes," Proc., IEEE International Conference on Acoustics, Speech and Signal Processing, ICASSP 2006, 4 pages.

(Continued)

*Primary Examiner* — Guy J Lamarre

(57) ABSTRACT

A decoding system for an iterative decoding of a parity check code comprises a first loop circuit adapted to store log-likelihood ratio values corresponding to a plurality of received data symbols in a memory unit; a second loop circuit adapted to compute a difference between a check-to-variable log-likelihood message at a second iteration step, and a check-to-variable log-likelihood message at a first iteration step, when the first iteration step precedes the second iteration step; and an adder unit adapted to update a log-likelihood ratio value stored on the first loop circuit by adding the difference computed in the second loop circuit; wherein the first loop circuit and the second loop circuit are synchronized such that the adder unit forwards the updated log-likelihood ratio value synchronously both to the first loop circuit and to the second loop circuit.

15 Claims, 7 Drawing Sheets

(56) References Cited

U.S. PATENT DOCUMENTS

2007/0089019 A1    4/2007  Tang et al.
2015/0098533 A1*   4/2015  Rusek .................. H04B 1/1027
                                                        375/350
2018/0287637 A1*  10/2018  Liu ........................ H03M 7/00

OTHER PUBLICATIONS

European Search Report, European Application No. 17205718.4, dated May 30, 2018, 9 pages.
Jin, J. et al., "An Energy Efficient Layered Decoding Architecture for LDPC Decoder," IEEE Transactions on Very Large Scale Integration (VLSI) Systems, vol. 18(8):1185-1195 (2010).
Radosavljevic, P. et al., "High-throughput multi-rate LDPC decoder based on architecture-oriented parity check matrices," Proc., 14th European Signal Processing Conference, EUSIPCO 2006, Florence, Italy, Sep. 4, 2006, 5 pages.

* cited by examiner

| $\Pi_{0,0}$ | $\Pi_{0,1}$ | $\Pi_{0,2}$ |             | $\Pi_{0,4}$ |             |
|-------------|-------------|-------------|-------------|-------------|-------------|
| $\Pi_{1,0}$ |             | $\Pi_{1,2}$ | $\Pi_{1,3}$ |             |             |
|             | $\Pi_{2,1}$ |             | $\Pi_{2,3}$ | $\Pi_{2,4}$ | $\Pi_{2,5}$ |
| $\Pi_{3,0}$ | $\Pi_{3,1}$ | $\Pi_{3,2}$ | $\Pi_{3,3}$ | $\Pi_{3,4}$ | $\Pi_{3,5}$ |

Fig. 1 (State of Art)

1. $v \leftarrow$ channel LLRs
2. $c2v_0 \leftarrow 0$
3. for $i = 1$ to $I$ do
4.    for each block row $r$ do
5.       $v2c_i[r] \leftarrow v[r] - c2v_{i-1}[r]$
6.       $c2v_i[r] \leftarrow \text{SPCdec}(v2c_i[r])$
7.       $v[r] \leftarrow v2c_i[r] + c2v_i[r]$
8.    end for
9. end for
10. return $v$ Fig. 2 (State of Art)

1. $v \leftarrow$ channel LLRs
2. $c2v_0 \leftarrow 0$
3. for $i = 1$ to $I$ do
4.    for each block row $r$ do
5.       $v2c_i[r] \leftarrow v[r] - c2v_{i-1}[r]$
6.       $c2v_i[r] \leftarrow \text{SPCdec}(v2c_i[r])$
7.       $\Delta v_i[r] \leftarrow c2v_i[r] - c2v_{i-1}[r]$
8.       $v[r] \leftarrow v[r] + \Delta v_i[r]$
9.    end for
10. end for
11. return $v$ Fig. 3 (State of Art)

1    $s = \text{sign}(v2c_i[r])$

2    $(\mu_0, \mu_1, \mu_2, \mu_3, l_0, l_1) \leftarrow \text{PartialSort}(v2c_i[r])$ 3    $(m_{0,1,2}, m_{0,2,3}, m_{1,2,3}) \leftarrow \text{NLFunction}(\mu_0, \mu_1, \mu_2, \mu_3, l_0, l_1)$ 4    for $k \in V$ do

5      $c2v_i[r][k] \leftarrow \text{C2VSelector}(m_{0,1,2}, m_{0,2,3}, m_{1,2,3}, l_0, l_1, s, k)$ 6    end for

7    return $c2v_i[r]$

Fig. 7

DECODING METHOD AND DECODING SYSTEM FOR A PARITY CHECK CODE

PRIORITY INFORMATION

This application claims priority to and the benefit of European Patent Application No. 17205718.4, filed in the European Patent Office on Dec. 6, 2017, the entire contents of which are incorporated herein by reference.

TECHNICAL FIELD

The invention relates to the field of decoding for parity-check codes, in particular high-speed decoding for low-density parity-check (LDPC) codes.

BACKGROUND, NOTATION AND STATE OF THE ART

Low-density parity-check (LDPC) codes are a family of linear codes characterized by a sparse parity-check matrix (PCM). They are usually decoded by means of a sum-product algorithm. Nowadays, LDPC codes belong to the most efficient known classes of error-correcting codes and find an ever-growing number of applications.

F. R. Kschischang et al. offer a unified presentation of the sum-product algorithm in the paper "Factor graphs and the sum-product algorithm," published in 2001 in the IEEE Transactions on Information Theory, vol. 47, no. 2, pages 498-519. A LDPC code can be represented by a factor graph whose factor nodes and variable nodes correspond to the check equations and to the code variables, respectively. Decoding can be realized by passing iteratively sum-product messages along the edges of the factor graph.

The sum-product algorithm usually follows a two-phase scheduling. Within each iteration, first all messages from the variable nodes to the check (i.e. factor) nodes (the "variable-to-check" messages), and then all messages from the check nodes to the variable nodes (the "check-to-variable" messages) are computed and propagated.

Engling Yeo et al., in the paper "High throughput low-density parity-check decoder architectures," published in 2001 in the Proceedings of the Global Telecommunications Conference, 2001 (GLOBECOM '01), vol. 5, pages 3019-3024, introduce an alternative scheduling called "staggered scheduling". According to this approach, check nodes are gathered in several groups. The nodes belonging to the same group are processed simultaneously, whereas the different node groups are processed sequentially. As a consequence, the intermediate updates obtained from each group are available to the subsequent groups already within the same iteration. Not only leads this scheduling to an improved performance, but it also requires less storage.

M. Mansour and N. R. Shanbhag, in the paper "High-throughput LDPC decoders," published in IEEE Transactions on Very Large Scale Integration (VLSI) Systems, vol. 11, no. 6, pages 976-996, 2003, present the turbo-decoding message-passing (TDMP) algorithm, which relies upon the same scheduling.

D. E. Hocevar introduces, in the paper "A reduced complexity decoder architecture via layered decoding of LDPC codes," published in the Proceedings of IEEE Workshop on Signal Processing Systems, 2004 (SIPS 2004), pages 107-112, a "layered decoding", which exploits similar ideas.

Layered decoding, or TDMP, or staggered scheduling, perform best when the check equations that are processed in parallel are mutually independent. "Layered LDPC codes", in the sense of the present disclosure, may be defined by a PCM with block structure whose sub-matrices are permutation matrices of uniform size p×p. In the following, we call each group of p subsequent rows a "block row", and each group of p subsequent columns a "block column".

For illustration, FIG. 1 shows the PCM of an exemplary layered LDPC code, where $\Pi_{i,j}$ denotes the permutation sub-matrix at the intersection of the i-th block row and the j-th block column, and the empty entries correspond to zero sub-matrices of size p×p. Since permutation matrices have a constant row and column weight of one, each "block row", corresponds to mutually independent equations, i.e., equations involving disjoint sets of variables. Consequently, layered LDPC codes are well-suited for layered decoding with a maximum degree of parallelism of p check nodes.

Decoding of binary LDPC codes is usually implemented in log-likelihood ratio (LLR) arithmetic. The decoder is provided with channel LLRs, which express the probability that each bit is 0 or 1. For a memory-less channel and identically distributed bits, the LLRs can be defined as $$\Lambda_i \triangleq \log \frac{Prob\{b_i = 0 \mid y\}}{Prob\{b_i = 1 \mid y\}} = \log \frac{Prob\{y \mid b_i = 0\}}{Prob\{y \mid b_i = 1\}}, \quad (1)$$

where log denotes the natural logarithm, y is the received signal and $b_i$ is the i-th bit. Extracting the sign of a LLR is equivalent to taking a hard decision, whereby positive and negative values correspond to 0 and 1, respectively. For more details on the LLR arithmetic we refer to the paper by J. Hagenauer et al., "Iterative decoding of binary block and convolutional codes," published in IEEE Transactions on Information Theory, vol. 42, no. 2, pages 429-445, 1996.

The pseudo-code of the layered sum-product decoding algorithm is schematically illustrated in FIG. 2, where I is the maximum number of decoding iterations,
v is the vector of the "a posteriori" LLRs of all the variables,
$c2v_i$ is the vector of all check-to-variable LLR messages at the end of the i-th iteration, and
$v2c_i$ is the vector of all variable-to-check LLR messages at the i-th iteration.

Further, we denote by v[r], $c2v_i[r]$ and $v2c_i[r]$ the slices of the respective sum-product message vectors involved in the processing of the r-th block row. With reference to FIG. 1, v[0] indicates the variable LLRs involved in the processing of the first block row, i.e., the LLRs of the block columns 0, 1, 2 and 4. In the same way, $c2v_i[0]$ and v2c1[0] denote the messages passed at the crossing of the block row o with the block columns 0, 1, 2 and 4. Extracting these slices generally involves some shuffling operation on the messages. Shuffling is therefore implicit in the adopted indexing convention.

Each row of the PCM represents a single-parity check (SPC) code. The SPCdec function used at line 6 of FIG. 2 processes in parallel the p SPC codes corresponding to the r-th block row. For each SPC code this function computes the message $$c2v_i(k) = \boxplus_{\substack{l \in V \\ l \neq k}} v2c_i(l) \quad (2)$$

that will be sent from the check node to each k-th variable node in the set V of involved variables. Here $v2c_i(l)$ is the current message originating from the l-th variable node of the SPC code, and ⊞ denotes the associative and commutative LLR exclusive-or (XOR) operator defined by $$x \boxplus y \triangleq \text{sign}(x) \cdot \text{sign}(y) \cdot [\min(|x|, |y|) + f_{nl}(|x| + |y|) - f_{nl}(||x| - |y||)] \quad (3)$$

with $$f_{nl}(x) \triangleq \log(1 + e^{-x}), \quad (4)$$

which may be approximated well in terms of linear functions.

The algorithm of FIG. 2 encompasses a processing loop over the a posteriori LLRs of the code variables. The values computed at line 7 when processing the r-th block row are required at the (r+1)-th block row to execute line 5. Obviously, the decoding process cannot proceed till the result of the previous block row is available.

In any practical VLSI implementation the loop at lines 4-8 has an inevitable latency dictated by technological constraints. The presence of wait cycles in the scheduling is equivalent to a reduction of the system clock frequency, and therefore leads to a lowering of the throughput and/or of the number of decoding iterations, which are both undesirable effects.

In U.S. Pat. No. 7,174,495 B2 entitled "LDPC decoder, corresponding method, system and computer program," E. Boutillon et al. introduce a general architecture for the implementation of LDPC decoders. They explain that if the decoder does not honour the wait cycles, the update of the a posteriori variable LLRs suffers from inconsistencies, which they call "cut-edge conflicts". In our notation, US '495 considers the difference, or "delta"

$$\Delta_i \triangleq = c2v_i - c2v_i - c2v_{i-1}. \quad (5)$$

After being properly shuffled, this delta is added to the a posteriori variable LLRs. However, US '495 requires an additional connection from the storage of the a posteriori variable LLRs to the adder circuit, and hence a second read port.

In a LDPC decoder the width of the RAM ports grows linearly with both the data throughput and the maximum number of supported iterations. For high-speed high-performance decoders the area and the power consumption of the RAM is dominated by the ports rather than the storage. A dual port RAM with one write and two read ports is almost twice as large as a two-port RAM with one write port and one read port. Therefore, the increase of area and power consumption make the techniques of US '495 practically unattractive for the considered class of applications.

A similar architecture has been proposed by M. Rovini et al. in the paper "Layered Decoding of Non-Layered LDPC Codes," published in the proceedings of the 9th EUROMICRO Conference on Digital System Design (DSD '06), 2006, pages 537-544. In this case the conflicts do not arise because the necessary wait cycles are disregarded, but because the considered LDPC codes are "non-layered". Check equations that are processed in parallel are not independent, which results in concurrent updates of the same sets of variables. The so-called "delta-based" architecture proposed by the authors relies upon the computation of the increments of the variable LLRs. A dual port memory with one write port and two read ports (rather than a two-port memory with one write port and one read port) is required. Further, all decoder memories must be triggered at twice the system frequency. The same considerations made above regarding the drawbacks of multi-port RAMs apply also to this architecture. In addition, the use of dual clock edge triggered memories makes this solution even less suited for high-speed applications.

More variants of the same idea have been considered to avoid the conflicts that arise when decoding non-layered LDPC codes. S. Müller et al., in the paper "A novel LDPC decoder for DVB-S2 IP," published in the Proceedings of the Design, Automation & Test in Europe Conference & Exhibition, 2009 (DATE '09), pages 1308-1313 describe a solution suited for LDPC codes whose parity check matrix contains sub-matrices that are superpositions of two circulant permutation matrices. The architecture contains, in addition to the main storage for the variable LLRs, an "a-posterior register" whose complexity scales unfavourably when the conflicts arise from multiple wait cycles rather than from selected sub-matrices with weight-two rows and columns.

The solutions described above can be collectively called "delta architectures". We condense the basic idea in the pseudo-code algorithm of FIG. 3. Essentially, the update at line 7 of FIG. 2 is split into the two steps at lines 7 and 8 of FIG. 3

We observe that a systolic implementation of the delta architecture according to FIG. 3 requires simultaneous access to three different check-to-variable messages to compute the variable-to-check messages at line 5 and the delta value at line 7. Prior-art solutions resort to a dual port RAM with one write and two read ports to store the check-to-variable messages. The two read ports are required to access $c2v_{i-1}[r]$ and $c2v_i[r]$, and an additional delay line is necessary to make the $c2v_{i-1}[r]$ messages available both for the computations at line 5 and a line 7. Once again, dual port RAMs with one write and two read ports represent a critical drawback. Additionally, the delay line consumes a significant amount of area and power in a VLSI implementation.

A further important aspect, which has repercussions on the whole realization of a LDPC decoder, is the implementation of the LLR-XOR ⊞ operator of Eq. (3). Several efficient approximations have been discussed in the prior art. Besides the single core operator, also chains of LLR-XORs have been considered. Here we focus on the simultaneous approximation of the whole chains of LLR-XORs in Eq. (2) for all k∈V, i.e., on the implementation of the SPCDec function.

J. Hagenauer et al., in the paper "Iterative decoding of binary block and convolutional codes," published in IEEE Transactions on Information Theory, vol. 42, no. 2, pages 429-445, 1996, suggest to approximate the LLR-XOR of J operands as $$\boxplus_{j=1,2,\ldots,J} LLR_j \cong \prod_{j=1,2,\ldots,J} \text{sign}(LLR_j) \cdot \min_{j=1,2,\ldots,J} |LLR_j|. \quad (6)$$

The modified version of the sum-product algorithm obtained by using this approximation is called min-sum (MS) algorithm.

M. P. C. Fossorier et al., in the paper, "Reduced complexity iterative decoding of low-density parity check codes based on belief propagation," vol. 47, no. 5, pages 673-680, May 1999, observe that with the MS algorithm, all the check-to-variable messages in Eq. (2) for k e V can be calculated by identifying the two minimum values of the magnitudes of the variable-to-check messages. In equations, given $$l_0 \triangleq \underset{l \in V}{\text{argmin}} |v2c_i(l)| \quad (7)$$

$$m_0 \triangleq |v2c_i(l_0)|$$

-continued $$m_1 \triangleq \min_{\substack{l \in V \\ l \in 0}} |v2c_i(l)|, \quad (8)$$

the k-th check-to-variable message in Eq. (2) can be approximated as $$c2v_i(k) \cong \begin{cases} \prod_{\substack{l \in V \\ l \neq k}} \text{sign}(v2c_i(l)) \cdot m_0 & (k \neq l_0) \\ \prod_{\substack{l \in V \\ l \neq k}} \text{sign}(v2c_i(l)) \cdot m_1 & (k = l_0) \end{cases}. \quad (9)$$

The MS algorithm results in a simple implementation, but is known to suffer from a significant performance penalty with respect to the exact sum-product algorithm.

F. Guilloud et al., in the paper "λ-min decoding algorithm of regular and irregular LDPC codes," published in the Proceedings of the 3rd International Symposium on Turbo Codes & Related Topics, 2003, pages 451-454, introduce a more accurate approximation, which uses only the λ lowest magnitudes of the variable-to-check messages and the corresponding indexes $l_0, l_1, \ldots, l_{\lambda-1}$ determined as $$l_k \triangleq \arg \min_{\substack{l \in V \\ l \notin \{l_0, l_1, \ldots, l_{k-1}\}}} |v2c_i(l)| \quad (10)$$

(for $k = 0, 1, \ldots, \lambda - 1$).

According to the λ-min algorithm, the check-to-variable messages in Eq. (2) are approximated as $$c2v_i(k) \cong \left[ \prod_{\substack{l \in V \\ l \neq k}} \text{sign}(v2c_i(l)) \right] \cdot \left[ \boxplus_{\substack{l = l_0, l_1, \ldots, l_{\lambda-1} \\ l \neq k}} |v2c_i(l)| \right], \quad (11)$$

where the second factor can take only λ+1 distinct values.

Both the MS and the λ-min algorithm can be expressed in the form $$c2v_i(k) \cong \left[ \prod_{\substack{l \in V \\ l \neq k}} \text{sign}(v2c_i(l)) \right] \cdot m(k), \quad (12)$$

where the magnitude $m(k) \geq 0$ takes values in a reduced set M with respect to the exact sum-product implementation. The selection of $m(k) \in M$ depends on a certain set L of indices. For the MS algorithm $$L \triangleq \{l_0\}, \quad (13)$$

whereas for the λ-min algorithm $$L \triangleq \{l_0, l_1, \ldots, l_{\lambda-1}\}. \quad (14)$$

It has been suggested to improve either algorithm by introducing a corrective multiplicative factor α>0 or an additive offset β>0 or both, as shown in the following generalized expression $$c2v_i(k) \cong \left[ \prod_{\substack{l \in V \\ l \neq k}} \text{sign}(v2c_i(l)) \right] \cdot \alpha \cdot \max(M(k) - \beta, 0), \quad (15)$$

where the maximum operation guarantees that the offset does not invert the sign of the message. We refer to any algorithm of the type of Eq. (15) as a generalized reduced magnitude-choice (GRMC) algorithm. We notice that, by extension, the exact sum-product algorithm can be regarded as a GRMC algorithm with a number of different message magnitudes equal to the cardinality of V and with α=1 and β=0.

In view of the problems of the prior art described above, what is required is an improved decoding system and method that overcomes the loop-latency problems and achieves high-performance LDPC decoding at very high data rates.

OVERVIEW OF THE INVENTION

This objective is achieved with a decoding system for iterative decoding of a parity check code according to independent claim 1, and a method for iterative decoding of a parity check code according to independent claim 9. The dependent claims relate to preferred embodiments.

In a first aspect, the disclosure relates to a decoding system for iterative decoding of a parity check code, comprising: a first loop circuit adapted to store log-likelihood ratio values corresponding to a plurality of received data symbols in a memory unit, and a second loop circuit adapted to compute a difference between a check-to-variable log-likelihood message at a second iteration step, and a check-to-variable log-likelihood message at a first iteration step, wherein the first iteration step precedes the second iteration step. The decoding system further comprises an adder unit adapted to update a log-likelihood ratio value stored in the first loop circuit by adding the difference computed in the second loop circuit. The first loop circuit and the second loop circuit are synchronized such that the adder unit forwards the updated log-likelihood ratio value synchronously both to the first loop circuit and to the second loop circuit.

The synchronized decoding system according to the invention reduces wait cycles, and minimizes the number of read and write accesses. This allows for an efficient high-performance decoding system and method that can attain very high data rates.

The first loop circuit may be adapted to provide the stored log-likelihood ratio value to the adder unit.

The second loop circuit may be adapted to provide the computed difference to the adder unit.

The adder unit may interconnect the first loop circuit and the second loop circuit.

According to an embodiment, the decoding system may be adapted such that the first loop circuit provides the stored log-likelihood ratio value and the second loop circuit provides the computed difference to the adder unit synchronously.

According to an example, the second loop circuit may be adapted to schedule the computation of the difference such that it matches a read access of a stored log-likelihood ratio value in the first loop circuit.

In an embodiment, the first loop circuit may be implemented in hardware. In other examples, the first loop circuit may be implemented in software. In still further examples, the first loop circuit may be implemented partly in hardware and partly in software.

Similarly, the second loop circuit may be implemented in hardware. In other examples, the second loop circuit may be implemented in software. In still further embodiments, the second loop circuit may be implemented partly in hardware and partly in software.

An output node of the adder unit may be connected to an input node of the memory unit, in particular via a first loop path.

According to an embodiment, the first loop circuit may be adapted to store the updated log-likelihood ratio value in the memory unit.

The decoding system may be adapted to access the memory unit with only a single read operation per iteration, and/or only a single write operation per iteration.

According to an embodiment, the adder unit may be adapted to backfeed the computed log-likelihood ratio value into the first loop circuit and/or into the second loop circuit.

The second loop circuit may be further adapted to compute a variable-to-check log-likelihood message based at least in part on the updated log-likelihood ratio value.

The second loop circuit may comprise a processing unit with an input node connected to an output node of the adder unit, via a second loop path, and an output node connected to an input of the adder unit. The processing unit may be adapted to compute the difference between the check-to-variable log-likelihood message at the second iteration step, and the check-to-variable log-likelihood message at the first iteration step.

According to an embodiment, the second loop circuit, in particular the processing unit comprises a permutator element adapted to route the updated log-likelihood ratio value to corresponding check nodes.

An output node of the adder unit may be connected to a second loop path pertaining to the second loop circuit. The second loop path may be connected to an input of the permutator element.

Further, the second loop circuit, in particular the processing unit may comprise an inverse permutator element, wherein the inverse permutator element may be adapted to reverse a permutation introduced by the permutator element to the computed difference, in particular prior to providing the computed difference to the adder unit.

According to an embodiment, the second loop circuit, in particular the processing unit may be adapted to compute a check-to-variable log-likelihood message from at least one variable-to-check log-likelihood message.

According to an example, the second loop circuit is adapted to compute a check-to-variable log-likelihood message on a basis of only a subset of variable-to-check log-likelihood messages.

This provides an approximation that allows computing the check-to-variable log-likelihood messages more efficiently, and hence contributes to the high-performance decoding of the present invention.

In particular, the second loop circuit may be adapted to compute the check-to-variable log-likelihood message on a basis of a subset of a number of k variable-to-check log-likelihood messages with the smallest magnitudes, for an integer k.

According to an example, the second loop circuit may be adapted to compute the check-to-variable log-likelihood message on a basis of an approximation of an exclusive or operation of a plurality of variable-to-check log-likelihood messages.

The second loop circuit may be adapted to store the check-to-variable log-likelihood messages in a second memory unit.

The decoding system may be adapted to access the second memory unit with only a single read operation per iteration, and/or only a single write operation per iteration.

In a second aspect, the invention relates to a method for iterative decoding of a parity check code, comprising: storing log-likelihood ratio values corresponding to a plurality of received data symbols in a memory unit of a first loop circuit; computing a difference between a check-to-variable log-likelihood message at a second iteration step, and a check-to-variable log-likelihood message at a first iteration step by means of a second loop circuit, wherein the first iteration step precedes the second iteration step; updating a log-likelihood ratio value stored in the first loop circuit by adding the difference computed in the second loop circuit; and synchronizing the first loop circuit and the second loop circuit such that the updated log-likelihood ratio value is provided synchronously both to the first loop circuit and to the second loop circuit.

According to an example, synchronizing comprises scheduling the computing of the difference in the second loop circuit in synchronization with a step of accessing a stored log-likelihood ratio value in the first loop circuit.

According to an embodiment, the method comprises storing the updated log-likelihood ratio value in the memory unit.

In particular, the method may comprise backfeeding the computed (updated) log-likelihood ratio value to the memory unit, in particular via a first feedback path.

The method may comprise accessing the memory unit with only a single read operation per iteration, and/or only a single write operation per iteration.

According to an embodiment, the method comprises backfeeding the computed (updated) log-likelihood ratio value into the first loop circuit and/or into the second loop circuit.

The method may further comprise computing a variable-to-check log-likelihood message based at least in part on the updated log-likelihood ratio value, in the second loop circuit.

According to an embodiment, the difference may be computed in a processing unit of the second loop circuit.

According to an embodiment, the method comprises backfeeding the computed log-likelihood ratio value from the adder unit to the processing unit, in particular via a second feedback path.

According to an embodiment, the method comprises routing the updated log-likelihood ratio value to corresponding check nodes by means of a permutation operation in the second loop circuit, in particular in the processing unit.

Further, the method may comprise reversing the permutation by means of an inverse permutation applied to the computed difference.

According to an example, the method comprises computing a check-to-variable log-likelihood message from at least one variable-to-check log-likelihood message in the second loop circuit, in particular in the processing unit.

According to an example, the method comprises computing a check-to-variable log-likelihood message on a basis of only a subset of variable-to-check log-likelihood messages, in particular on a basis of a subset of a number of k variable-to-check log-likelihood messages with the smallest magnitudes, for an integer k.

According to an embodiment, the method comprises computing the check-to-variable log-likelihood message on a basis of an approximation of an exclusive or operation of a plurality of variable-to-check log-likelihood messages.

The method may further comprise storing the check-to-variable message in the second loop circuit, in particular in a second memory unit.

The method may comprise accessing the second memory unit with only a single read operation per iteration, and/or only a single write operation per iteration.

BRIEF DESCRIPTION OF THE DRAWINGS

The features of the present invention and the numerous advantages associated therewith will be best apparent from a detailed description of example embodiments with reference to the accompanying drawings, in which:

FIG. 1 is a schematic diagram illustrating a parity check matrix of an exemplary layered LDPC code;

FIG. 2 is a schematic illustration of pseudo-code of a conventional layered decoding algorithm;

FIG. 3 is a schematic illustration of pseudo-code of a conventional layered decoding algorithm with delta architecture;

FIG. 7 is a schematic illustration of pseudo-code of a layered decoding algorithm according to an embodiment.

DESCRIPTION OF EMBODIMENTS

We describe a decoder architecture that overcomes the "loop-latency" problem and achieves high-performance LDPC decoding at very high data rates. The LDPC decoder architecture allows an efficient VLSI implementation and achieves high throughput and good performance virtually independently of the delay associated with the update of the a posteriori variable LLRs.

Our solution makes use of the increments of the a posteriori LLRs. However, in contrast to other delta architectures, it requires only a single read access and a single write access to the storage of the variable LLRs, and, thus, can be implemented with two-port RAMs with one read and one write port only (instead of dual port RAMs with two read ports and one write port).

The decoding method and decoding system may be employed for the transmission of digital information over optical networks. However, this is merely an example, and in general the decoding techniques according to the present disclosure may be employed for any kind of data storage, data compression, or data transmission over any possible transmission medium.

Figure 4:
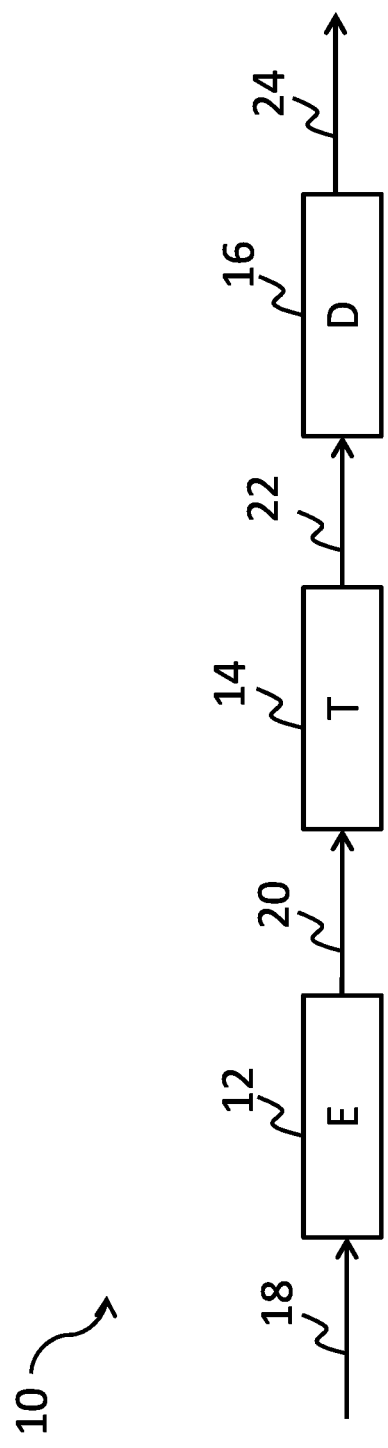
FIG. 4 is a schematic diagram illustrating a data transmission process that employs a decoding method and system according to an embodiment.

FIG. 4 is a schematic illustration of a data transmission system 10 that employs a decoding method and system according to an embodiment.

The data transmission system 10 comprises an encoding system 12, a transmission channel 14, and a decoding system 16. The encoding system 12 receives input symbols 18, such as a string of digital data bits, and encodes them by means of an encoding method that generates a string of code symbols 20. These code symbols 20 are subjected to the transmission channel 14, which models transmission of the code symbols 20 over a transmission path, such as an optical fibre channel, from a sender station to a receiver station. The transmitted code symbols 22 received at the receiver station may be subjected to the decoding system 16, which converts them into decoded code symbols 24. Ideally, the decoded code symbols 24 are identical to the input symbols 18, or at least a very close approximation.

In general, the input information may be represented by any kind of symbols, such as any b-ary symbols. However, in the following examples we focus on binary symbols, for the ease of presentation.

Decoding of binary LDPC codes can implemented in log-likelihood ratio (LLR) arithmetic, as explained above with reference to Eq. (1). The decoding system 16 is provided with channel LLRs, which express the probability that each bit is 0 or 1. Decoding may be implemented over a factor graph, which may correspond to an adjacency matrix of a parity check matrix, and may proceed in a plurality of decoding iterations A corresponding decoding structure is schematically illustrated in FIG. 5.

The decoding system 16 comprises a first loop circuit 26 and a second loop circuit 28, which may be implemented in hardware. The decoding system 16 further comprises an adder unit 30 that connects the first loop circuit 26 and the second loop circuit 28. Moreover, the decoding system comprises an input node 32, which is connected to the first loop circuit 26 and may initialize the decoding system 16 via a multiplexer unit 34. An output node 36 of the decoding system 16 is connected to the adder unit 30.

Figure 5:
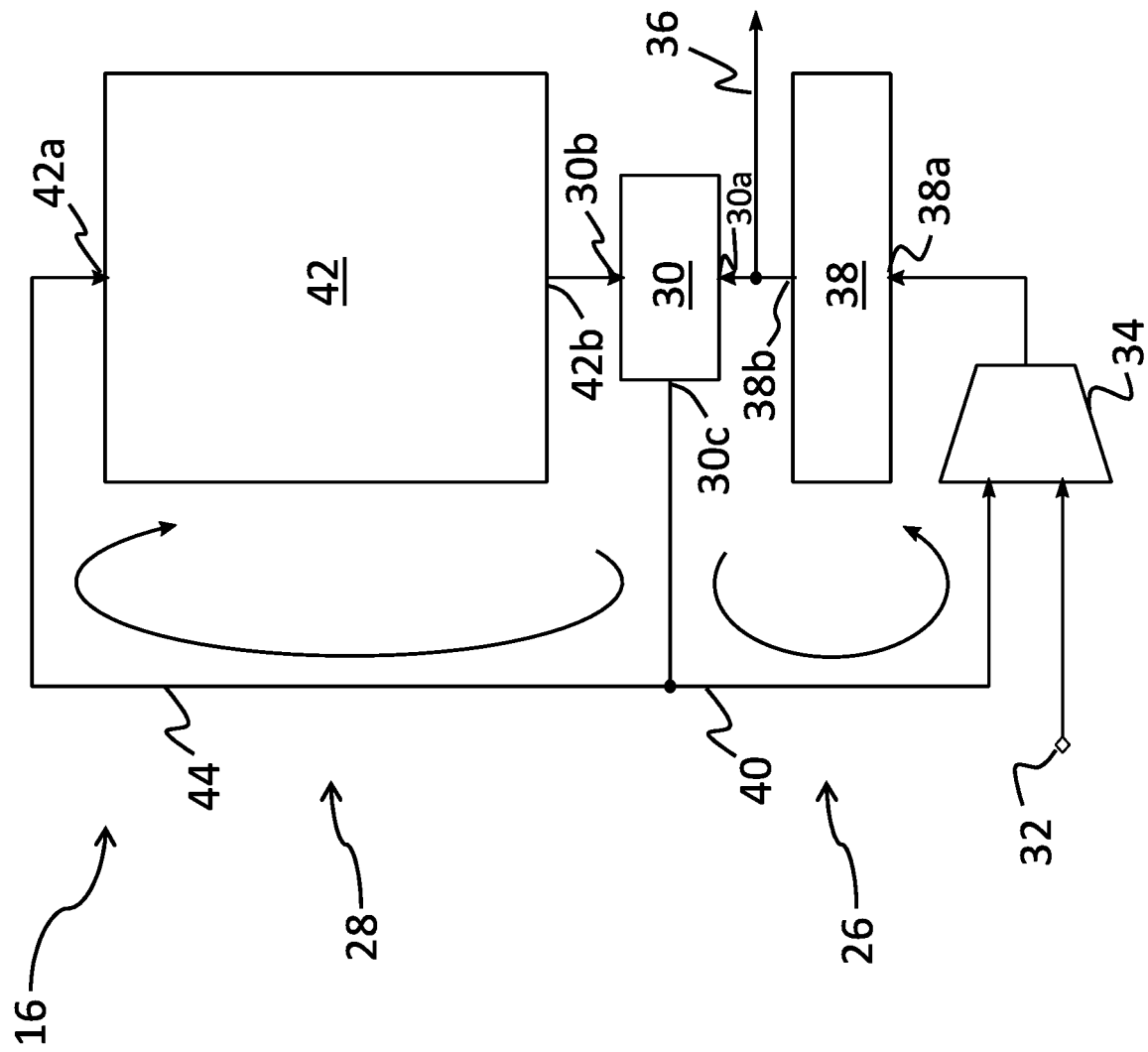
FIG. 5 is a schematic block diagram of a decoding system according to an embodiment.

As can be further taken from FIG. 5, the first loop circuit 26 comprises a memory unit 38 that is adapted to store log-likelihood ratio values v corresponding to a plurality of received code word symbols 22 of the decoding system 16. A memory input node 38a of the memory is connected to the multiplexer unit 34. A memory output 38b of the memory unit 38 is connected to a first input node 30a of the adder unit 30, and the first loop circuit 26 is adapted to provide the stored log-likelihood ratio values v[r] associated with the block row r to the first input node 30a of the adder unit 30 in accordance with a processing clock pulse.

An output node 30c of the adder unit is connected to the memory input node via a first loop line 40 and the multiplexer unit 34.

The second loop circuit comprises a processing unit 42 with an input node 42a that is connected to the output node 30c of the adder unit 30 via a second loop line 44, and an output node 42b connected to a second input node 30b of the adder unit 30. The processing unit 42 is adapted to compute the difference $\Delta_i c2v_i - c2v_{i-1}$ according to Eq. (5) between a check-to-variable log-likelihood message $c2v_i$ at a second (later) iteration step i, and a check-to-variable log-likelihood message $c2v_{i-1}$ at a first (earlier) iteration step i−1. The resulting difference is provided at the output node 42b to the second input node 30b of adder unit 30, which adds it to the log-likelihood ratio value v[r] received from the memory unit 38 at the first input node 30a, so as to update the log-likelihood ratio value v[r].

The updated log-likelihood ratio value is provided at the output node 30c of the adder unit 30, and is forwarded to both the first loop circuit 26 and the second loop 28 synchronously.

The decoder system 16 hence implements a double-loop architecture. While the second loop 28 (the "processing loop") processes the check nodes and computes the delta values, the first loop 26 (the "updating loop") uses the delta values to update the a posteriori LLRs. Differently from delta architectures of the prior art, the two loops 26, 28 are synchronized so that the updated a posteriori LLRs can be forwarded at the same time to the variable storage and the check node processor.

The synchronization of the two loops can be achieved by rescheduling the generation of the delta values in the processing unit 42 to match the next read access from the a posteriori LLR storage at the memory unit 38.

The task separation between the two loops allows to process a new block row before all the updates stemming from the previous block row have been applied. In a standard architecture that implements the layered decoding algorithm of FIG. 2, whenever processing and updating phases overlap, the intermediate updates are overwritten and the decoder ends up in an inconsistent state. By contrast, with the proposed architecture the pending updates are applied at a later time and not discarded. Thus, decoding does not incur catastrophic "cut-edge conflicts", but at most a negligible performance penalty, when the LLRs of some block columns occasionally may not contain the latest update. In practice this minor degradation is more than compensated by the possibility of increasing the processing speed and, therefore, the number of sum-product iterations.

The decoding schedule assures that the two loops operate synchronously so that, despite the double-loop architecture, only a single read and a single write access to the memory element 38 are sufficient.

For the check-to-variable messages stored in the processing unit 42, we may likewise use a memory unit with one read and one write port. In contrast to the prior art, our solution needs for the check-to-variable messages neither dual port RAMs with one write and two read ports nor delay lines.

Although the proposed solution can be implemented in conjunction with any LLR-XOR approximation compliant with Eq. (15), we develop a novel GRMC algorithm. Our approximation achieves a similar performance as the 3-min algorithm (i.e. the λ-min algorithm with λ=3), but requires both less storage and fewer computations.

We assume that the LDPC code is layered and that the constituent sub-matrices of its PCM have size p×p. The decoder is implemented in LLR arithmetic and processes a block column per clock cycle and one block row after the other. As illustrated in the example of FIG. 1, the various block rows may involve different numbers of block columns. During decoding, the block columns that do not intersect the currently processed block row are skipped. We assume a systolic decoder implementation whereby different functional blocks can operate at the same time on different block columns and possibly on different block rows. As explained above with reference to FIG. 5, the adder unit 30 is located at the intersection of the two loops 26, 28. It sums p delta messages received from the second loop 28 to the corresponding a posteriori p variables LLRs originating from the first loop 26, according to line 8 of the algorithm in FIG. 3. The resulting updated LLRs are injected into both loops 26, 28 via the first loop line 40 and second loop line 44, respectively.

The memory unit 38 of the first loop circuit 26 stores the a posteriori LLRs v of all the variables. Both the read port 38a and the write port 38b convey p messages in parallel. The LLRs are stored in their natural "unpermuted" order.

The multiplexer unit 34 routes towards the memory unit 38 either the updated a posteriori LLRs or, in the initialization phase, the channel LLRs according to line 1 in FIG. 3.

At the end of the decoding, the final LLRs for the previous code word are transferred from the memory unit 38 to the output node 36. In many applications, only the signs of the final LLRs, i.e., the hard decisions, are required at the output.

Figure 6:
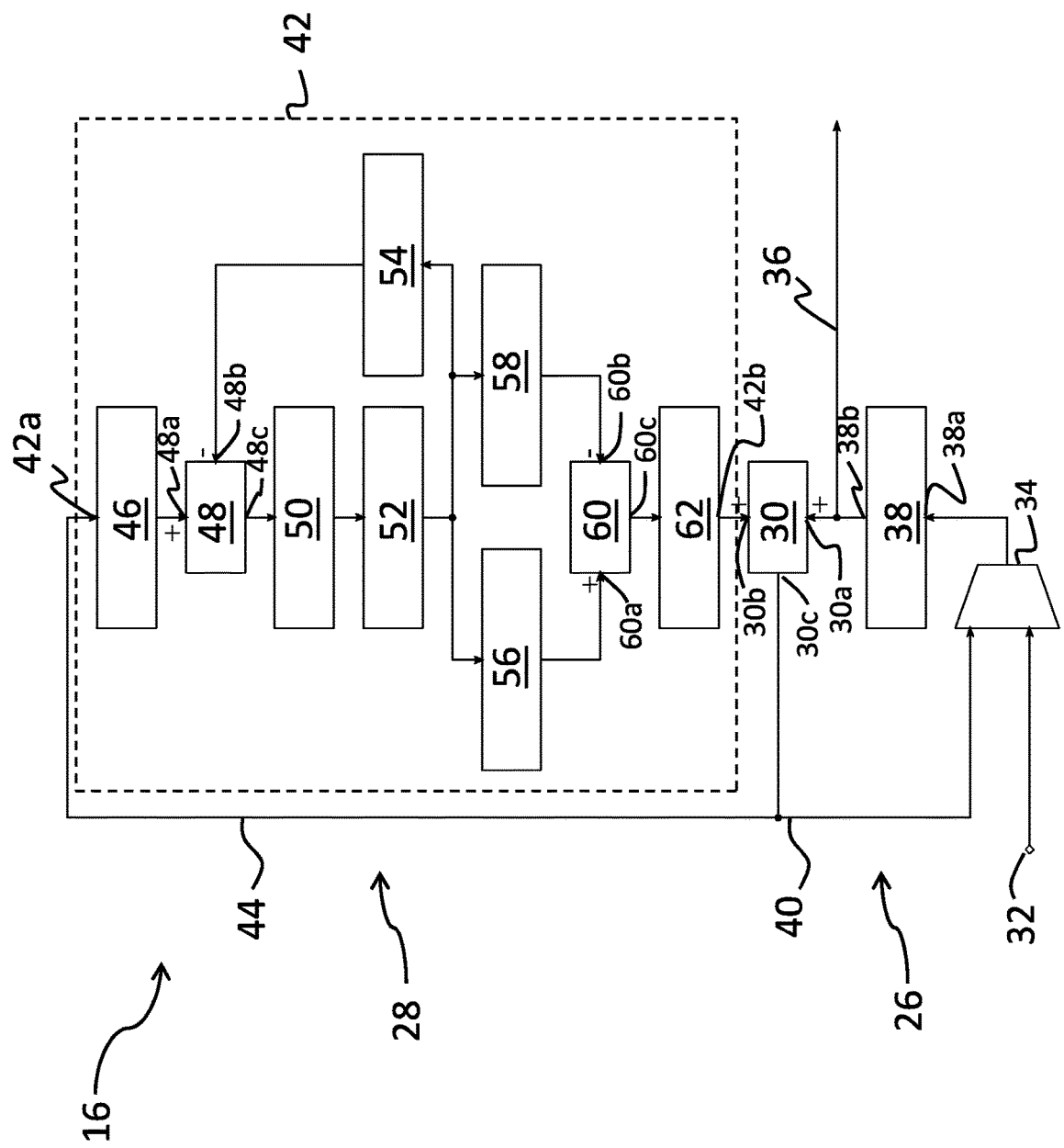
FIG. 6 is a schematic diagram illustrating the decoding system of FIG. 5 in additional detail.

The architecture and operation of the second loop circuit 28 and the delta computation will now be described in more detail with reference to FIG. 6, which shows the decoding system 16 of FIG. 5 with an additional level of granularity.

The processing unit 42 of the second loop circuit 28 comprises a permutator element 46, a first adder element 48, a decoder element 50, a second memory unit 52, three check-to-variable selector elements 54, 56, 58, a second adder element 60, and an inverse permutator element 62.

The permutator element 46 is connected to the input node 42a of the processing unit 42 and routes the variable LLRs from the second loop line 44 to the corresponding check nodes. The connections between the individual variables within the j-th block column and the individual check nodes of the i-th block row are determined by the permutation sub-matrix $\Pi_{i,j}$ of the PCM. Therefore, the permutator element 46 implements a time-varying permutation, which is configured according to the sub-matrix at the intersection of the currently processed block row and block column.

A first input node 48a of the adder element 48 is connected to an output of the permutator element 46, and a second input node 48b of the adder element 48 is connected to an output of the first check-to-variable selector element 54. In the adder element 48 the p a posteriori LLRs of the current block column are diminished by the check-to-variable messages computed at the same block row at the previous iteration, according to line 5 in FIG. 3

The p resulting variable-to-check messages are provided at the output node 48c of the first adder element 48, and are passed to the SPC decoder element 50, which is located downstream of the adder element 48. The decoder element 50 returns the intermediate results necessary to compute the new check-to-variable messages from the variable-to-check messages, such as according to Eq. (15). However, the decoder element may not necessarily compute the messages themselves. For instance, the decoder element 50 may merely provide the sign information of the new messages, the set M of possible magnitudes and the set L of required indices, which we denote in the following by "sign, magnitude and index" (SMI) data.

The second memory unit 52 is located downstream of the decoder element 50, and may be adapted to receive and store, for each block row, the SMI data computed by the decoder element 50. At the beginning of the decoding process, the magnitudes may be set to zero, which is equivalent to the initialization at line 2 of FIG. 3. The SMI data can be partitioned in $n_p \geq 1$ packets. Both the read and the write port convey in parallel one packet of SMI data.

The actual check-to-variable messages are computed in the check-to-variable selector elements 54, 56, and 58, which are connected downstream of the second memory unit 52. The SMI data are transferred over $n_p$ clock cycles from the second memory unit 52 to the individual C2V selector elements 54, 56, 58. Each C2V selector element 54, 56, 58 may contain a register bank that keeps a local copy of the SMI data for the currently processed block row.

The first selector element 54 computes the messages $c2v_{i-1}[r]$, which are then fed back to the second input node 48b of the first adder element 48 to execute line 5 of FIG. 3. The second selector element 56 and the third selector element 58 compute, respectively, the messages $c2v_i[r]$ and $c2v_{i-1}[r]$ that are provided to the respective first input node

60a and second input node 60b of the second adder element 60. The second adder element 60 then generates the incremental LLRs according to line 7 of FIG. 3, and provides them at an output node 60c.

With the assumed degree of parallelism of one block column, the number of cycles required to process a block row corresponds to the number of its permutation submatrices. If $w_{min}$ is the minimum row weight, the SMI data can be partitioned in at most $$n_{p\_max} = \left\lfloor \frac{w_{min}}{3} \right\rfloor \tag{16}$$

packets to ensure that all three accesses to the C2V storage can be completed through a single read port. We observe that higher values of $n_p$ are preferable because they correspond to a more compact C2V storage with a reduced port width.

The computation of the incremental LLRs in the second adder element 60 may be suitably delayed to achieve synchronization between the first loop 26 and the second loop 28. Namely, input and output of the second loop 28 may be mutually decoupled and scheduled in such a way that the LLRs and corresponding increments impinge at the same time at the adder unit 30.

To maximize the number of matches at the adder unit 30, we may reorder the sequence of block-rows and block-columns separately for the first loop 26 and the second loop 28. Depending on the specific PCM, it is typically possible to obtain a match for the near totality of the code variables.

The few unmatched LLR increments may be applied by running the first loop 26 only, while the second loop 28 is temporarily suspended. In the same way, the unmatched block columns can be processed by running the second loop 28 only, while the first loop 26 is temporarily suspended.

The inverse permutator element 62 is coupled to the output node 60c of the second adder element 60, and is adapted to reverse the permutation implemented by the permutator block 46 and bring the incremental LLRs into their natural "unpermuted" order. In detail, the inverse permutator element 62 may apply the permutation $\Pi_{i,j}^{-1}$ to the increments of the j-th block column originating from the i-th block row.

We now turn to the derivation of a simple and accurate GRMC algorithm for the computation of the check-to-variable messages from the variable-to-check messages. In analogy to Eq. (10) we define the indices of the four variable-to-check messages with the smallest magnitude as $$l_k \triangleq \arg\min |v2c_i(l)| \text{ (for } k=0,1,\ldots,3) \tag{17}$$

and, for economy of notation, we introduce $$\mu_k \triangleq |v2c_i(l_k)| \text{ (for } k=0,1,\ldots,3). \tag{18}$$

In contrast to the 3-min algorithm, which computes the three exact LLR-XORs of any two of the three smallest magnitudes and the exact LLR-XOR of all three of them, we compute selected approximated LLR-XORs of three of the four smallest magnitudes.

For m<n we approximate the LLR-XOR of $\mu_m$ and $\mu_n$ as $$\mu_m \boxplus \mu_n \approx \max(\mu_m - f_{nl}(\mu_n - \mu_m), 0), \tag{19}$$

where we exploit the fact that for non-negative arguments $f_{nl}$ is a positive decreasing function, and we neglect the second term within the brackets in Eq. (3). The maximum operation in Eq. (19) ensures that the sign of the result cannot become negative due to the approximation.

Using Eq. (19) we obtain for m<n<q $$\mu_m \boxplus \mu_n \boxplus \mu_q \approx \max(\mu_m - f_{nl}(\mu_n - \mu_m) - f_{nl}(\mu_q - \mu_m), 0), \tag{20}$$

where we neglect second order corrections to the arguments of the $f_{nl}$ terms.

For (m, n, q) equal to (0,1,2), (0,2,3) and (1,2,3) we obtain, respectively, $$m_{0,1,2} \triangleq \max(\mu_0 - \gamma_{0,1,2} \cdot [f_{nl}(\mu_1 - \mu_0) - f_{nl}(\mu_2 - \mu_0)], 0), \tag{21}$$

$$m_{0,2,3} \triangleq \max(\mu_0 - \gamma_{0,2,3} \cdot [f_{nl}(\mu_2 - \mu_0) - f_{nl}(\mu_3 - \mu_0)], 0), \tag{22}$$

and $$m_{1,2,3} \triangleq \max(\mu_1 - \gamma_{1,2,3} \cdot [f_{nl}(\mu_2 - \mu_1) - f_{nl}(\mu_3 - \mu_1)], 0), \tag{23}$$

Here we introduced the positive constant corrective factors $\gamma_{0,1,2}$, $\gamma_{0,2,3}$ and $\gamma_{1,2,3}$, which can be experimentally determined by optimizing the performance of the decoder. In practice, for the computation of Eqs. (21), (22) and (23) the function $f_{nl}$ can be approximated by a piecewise polynomial (in particular, linear) function.

Finally, the check-to-variable messages can be approximated as $$c2v_i(k) \cong \left[ \prod_{\substack{l \in V \\ l \neq k}} \text{sign}(v2c_i(l)) \right] \cdot \begin{cases} m_{0,1,2} & \text{if } k \neq l_0 \\ m_{0,2,3} & \text{if } k \neq l_1 \\ m_{1,2,3} & \text{otherwise} \end{cases} \tag{24}$$

For the proposed GRMC algorithm the sets L and M are defined as $$L \triangleq \{l_0, l_1\} \tag{25}$$

and $$M \triangleq \{m_{0,1,2}, m_{0,2,3}, m_{1,2,3}\}, \tag{26}$$

respectively and, therefore, the SMI data for each block row consist of the sign information of the individual check-to-node messages, three message magnitudes and two indices. For the joint computation of the three messages the function $f_{nl}$ must be evaluated 5 times. By comparison, for the 3-min algorithm of the state of the art, the SMI data consist of four message magnitudes and three indices, and the function $f_{nl}$ must be evaluated 8 times.

The amount of SMI data and the number of computations are directly related to the port width of the C2V storage in the second memory unit 52 and the complexity of the SPC decoder element 50, respectively. Therefore this algorithm can be conveniently employed within the decoder architecture of FIG. 6 to reduce the area and the power of the decoder without sacrificing its performance.

The proposed GRMC algorithm is summarized in pseudo-code in FIG. 7. The sign of the incoming variable-to-check messages are extracted at line 1. The function PartialSort at line 2 implements Eq. (17) and Eq. (18). Line 3 computes Eqs. (21), (22) and (23). Finally, at line 5 the check-to-variable messages are approximated according to Eq. (24).

Figure 8:
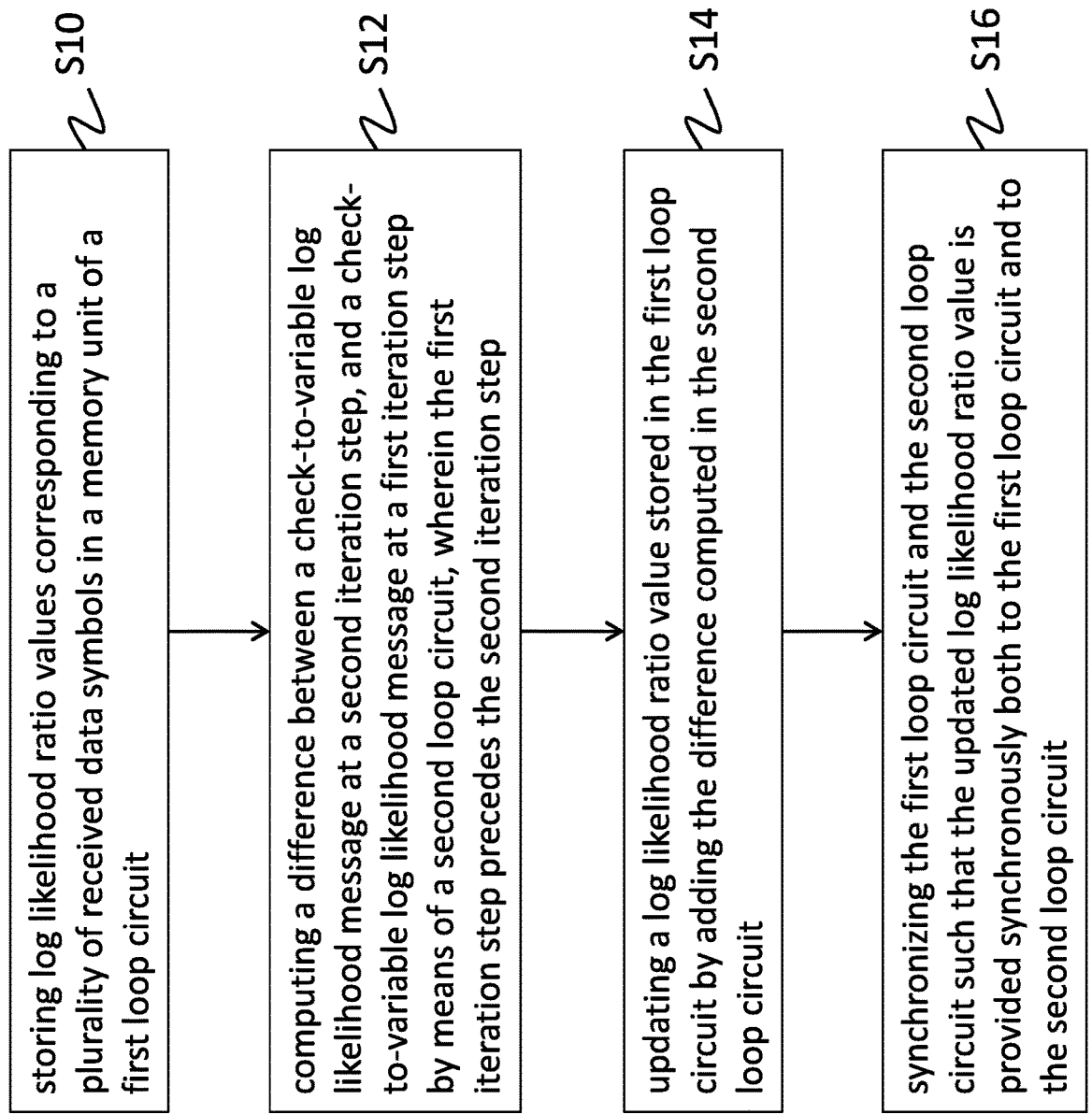
FIG. 8 is a flow diagram illustrating a method for iterative decoding of a parity check code according to an embodiment.

FIG. 8 is a flow diagram illustrating a method for iterative decoding of a parity check code according to an example.

In a first step S10, log-likelihood ratio values corresponding to a plurality of received data symbols are stored in a memory unit of a first loop circuit.

In a second step S12, a difference is computed between a check-to-variable log-likelihood message at a second iteration step, and a check-to-variable log-likelihood message at a first iteration step by means of a second loop circuit, wherein the first iteration step precedes the second iteration step.

In a third step S14, a log-likelihood ratio value stored in the first loop circuit is updated by adding the difference computed in the second loop circuit.

In a fourth step S16, the updated log-likelihood ratio value is provided synchronously both to the first loop circuit and to the second loop circuit The description of the embodiments and the drawings merely serve to illustrate the method and system according to the invention, but should not be understood to imply any limitation. The scope of the invention is to be determined from the appended claims.

The invention claimed is:

1. A decoding system for iterative decoding of a parity check code, comprising:
 a first loop circuit adapted to store log-likelihood ratio values corresponding to a plurality of received data symbols in a memory unit;
 a second loop circuit adapted to compute a difference between a check-to-variable log-likelihood message at a second iteration step, and a check-to-variable log-likelihood message at a first iteration step, wherein the first iteration step precedes the second iteration step; and
 an adder unit adapted to update a log-likelihood ratio value stored in the first loop circuit by adding the difference computed in the second loop circuit;
 wherein the first loop circuit and the second loop circuit are synchronized such that the adder unit forwards the updated log-likelihood ratio value synchronously both to the first loop circuit and to the second loop circuit.

2. The decoding system according to claim 1, wherein the first loop circuit is adapted to store the updated log-likelihood ratio value in the memory unit.

3. The decoding system according to claim 1, wherein the decoding system is adapted to access the memory unit with only a single read operation per iteration, and/or only a single write operation per iteration.

4. The decoding system according to claim 1, wherein the second loop circuit comprises a permutator element adapted to route the updated log-likelihood ratio value to corresponding check nodes.

5. The decoding system according to claim 4, wherein the second loop circuit comprises an inverse permutator element, wherein the inverse permutator element is adapted to reverse a permutation introduced by the permutator element to the computed difference.

6. The decoding system according to claim 1, wherein the second loop circuit is adapted to compute a check-to-variable log-likelihood message from at least one variable-to-check log-likelihood message.

7. The decoding system according to claim 1, wherein the second loop circuit is adapted to compute a check-to-variable log-likelihood message on a basis of only a subset of variable-to-check log-likelihood messages.

8. The decoding system according to claim 1, wherein the second loop circuit is adapted to compute the check-to-variable log-likelihood message on a basis of an approximation of an exclusive or operation of a plurality of variable-to-check log-likelihood messages.

9. A method for iterative decoding of a parity check code, comprising:
 storing log-likelihood ratio values corresponding to a plurality of received data symbols in a memory unit of a first loop circuit;
 computing a difference between a check-to-variable log-likelihood message at a second iteration step, and a check-to-variable log-likelihood message at a first iteration step by means of a second loop circuit, wherein the first iteration step precedes the second iteration step;
 updating a log-likelihood ratio value stored in the first loop circuit by adding the difference computed in the second loop circuit; and
 synchronizing the first loop circuit and the second loop circuit such that the updated log-likelihood ratio value is provided synchronously both to the first loop circuit and to the second loop circuit.

10. The method according to claim 9, further comprising storing the updated log-likelihood ratio value in the memory unit.

11. The method according to claim 9, wherein the memory unit is accessed with only a single read operation per iteration, and/or only a single write operation per iteration.

12. The method according to claim 9, further comprising routing the updated log-likelihood ratio value to corresponding check nodes by means of a permutation operation in the second loop circuit.

13. The method according to claim 9, further comprising computing the check-to-variable log-likelihood message from at least one variable-to-check log-likelihood message in the second loop circuit.

14. The method according to claim 9, further comprising computing the check-to-variable log-likelihood message on a basis of only a subset of variable-to-check log-likelihood messages.

15. The method according to claim 9, further comprising computing the check-to-variable log-likelihood message on a basis of an approximation of an exclusive or operation of a plurality of variable-to-check log-likelihood messages.

* * * * *